US005761537A

United States Patent [19]

Sturges et al.

[11] Patent Number: 5,761,537

[45] Date of Patent: Jun. 2, 1998

[54] METHOD AND APPARATUS FOR INTEGRATING THREE DIMENSIONAL SOUND INTO A COMPUTER SYSTEM HAVING A STEREO AUDIO CIRCUIT

[75] Inventors: Jay J. Sturges, Orangevale; David I. Poisner, Folsom, both of Calif.

[73] Assignee: Intel Corporation, Santa Clara, Calif.

[21] Appl. No.: 537,423

[22] Filed: Sep. 29, 1995

[51] Int. Cl.[6] .......... H01S 5/02

[52] U.S. Cl. .......... 395/892; 395/842; 395/2.87; 395/18; 395/111; 348/500

[58] Field of Search .......... 395/842, 892, 395/821, 287; 364/514 R; 381/18, 119; 348/432, 500

[56] References Cited

U.S. PATENT DOCUMENTS

| | | | |
|---|---|---|---|
| 5,045,940 | 9/1991 | Perters et al. | 348/472 |
| 5,351,092 | 9/1994 | Poimboeuf et al. | 348/512 |
| 5,402,499 | 3/1995 | Robinson et al. | 381/119 |
| 5,418,321 | 5/1995 | Keller et al. | 84/606 |
| 5,594,660 | 1/1997 | Sung et al. | 364/514 R |
| 5,596,558 | 1/1997 | Arataki et al. | 369/53 |
| 5,625,843 | 4/1997 | Lee | 395/842 |
| 5,630,175 | 5/1997 | Gajewski et al. | 395/892 |

*Primary Examiner*—Christopher B. Shin
*Attorney, Agent, or Firm*—Blakely, Sokoloff, Taylor & Zafman

[57] ABSTRACT

The computer system includes a stereo audio circuit a universal serial bus (USB) controller, or other isochronous device controller. Left front and right front stereo audio channels are routed through the audio circuit to a pair of stereo speakers. One or more surround sound channels, perhaps including left rear and right rear channels, are routed through the USB controller to one or more USB peripheral surround sound speakers. The audio circuit and the USB controller operate from separate asynchronous clocks. A variety of techniques are disclosed for maintaining synchronization of the audio signals routed through the audio circuit and through the USB controller despite possible clock skew between the asynchronous clocks. Method and apparatus embodiments of the invention are disclosed.

18 Claims, 8 Drawing Sheets

METHOD AND APPARATUS FOR INTEGRATING THREE DIMENSIONAL SOUND INTO A COMPUTER SYSTEM HAVING A STEREO AUDIO CIRCUIT

BACKGROUND OF THE INVENTION

1. Field of the Invention

The invention generally relates to computer systems and in particular to audio components for use within computer systems.

2. Description of Related Art

The trend in home audio entertainment is to provide three dimensional sound or "surround sound" whereby three or more audio channels are employed. Typically, traditional left and right stereo channels are provided to a pair of stereo speakers. At least one surround sound channel is provided to a third speaker, typically located behind the listener. A separate audio track is provided to the third speaker which includes sounds provided to simulate three dimensional audio. For example, the additional audio track may include sound echoes synchronized with sounds broadcast through the pair of stereo speakers to simulate three dimensional audio.

Such surround sound or three dimensional sound systems are becoming increasingly popular in connection with home entertainment systems having a television, video cassette recorder (VCR) and a stereo. Many such systems employ three or more speakers beyond the two traditional stereo speakers to provide enhanced three dimensional sound simulation.

Typical personal computer systems for the home or office employ an audio or sound circuit for use in driving a pair of analog speakers connected to the computer system. The audio circuit may be an integrated circuit mounted directly on the motherboard of the computer system or may be mounted on a separate audio or sound card connected to the motherboard. The audio circuit receives digitized audio signals corresponding to left and right stereo channels, converts the digitized signals to analog signals, and outputs the analog signals to the speakers. The digitized audio signals are typically either provided by an external CD ROM drive, provided by a floppy disk drive or are synthesized or otherwise generated by a microprocessor of the computer system. Although a wide range of computer applications may utilize the audio system, the use of audio is most widespread in connection with games or similar entertainment applications.

It would be desirable to provide personal computer systems with similar three dimensional sound capabilities similar to those of home entertainment systems. In one possible implementation, enhanced audio circuits capable of processing surround sound channels are provided. However, to gain the benefits of surround sound, the user must replace the conventional stereo audio circuit with the enhanced audio circuit, as well as provide additional speakers. Such enhanced audio circuits may be rather expensive. Moreover, depending upon the implementation of the enhanced audio circuit, it may not be possible to run conventional software programs in connection with the enhanced audio circuit.

Hence, it would be desirable to provide a less expensive alternative solution, particularly one which integrates surround sound into a computer system already including a stereo audio circuit and which is fully or substantially compatible with conventional or "legacy" application programs.

SUMMARY OF THE INVENTION

In accordance with the invention, surround sound capabilities are provided within a personal computer system having a stereo audio circuit by routing left and right audio channels through the audio circuit to a pair of stereo speakers and routing at least one surround sound channel through a universal serial bus (USB) controller or other isochronous device, to at least one additional speaker, which may be a USB peripheral. By routing the surround sound channel through the USB controller, surround sound capabilities are conveniently added to the system employing a stereo audio circuit. Accordingly, users are not necessarily required to obtain a surround sound audio circuit and the computer system may reliably run pre-existing application programs which provide only stereo audio channels.

In an exemplary implementation, the audio circuit, the USB controller, and the USB peripheral are driven from separate asynchronous clock signals provided by separate clock sources. Both the audio circuit and the USB controller include respective direct memory access (DMA) drivers for coordinating transference of data from a computer memory through respective first in first out (FIFO) buffers.

Because asynchronous clock signals are employed, it is important to maintain synchronization of the audio channels routed through the audio circuit and the audio channels routed through the USB controller to the USB peripheral. Clock skew among the asynchronous clock signals may cause audio data to be processed at different rates by the audio circuit and the USB controller. As such, the surround sound channel may become offset from the stereo sound channels thereby diminishing the three dimensional sound effect provided by the surround sound channel. Indeed, for long audio passages, clock skew may result in a significant offset between the stereo audio channels and the surround sound channel, perhaps resulting in a ten or twenty second mismatch. Accordingly, means are provided for synchronizing surround sound channels routed through the USB controller to the USB peripheral, with audio channels routed through the audio circuit.

In a first embodiment, synchronization is achieved by providing means, connected to the audio circuit, for receiving a synchronization signal from the USB controller and for synchronizing the left and right audio channels using the synchronization signals. For systems wherein the USB controller receives and processes data in frames, the synchronization signal may be generated upon detection of each end of frame.

In a second embodiment, the means for synchronizing includes means for throttling the DMA of the audio circuit. The synchronization signal is transmitted from the USB controller directly to the DMA of the audio circuit. Throttling of the DMA is performed based upon the synchronization signal.

In a third embodiment, means are provided for throttling the DMA of the USB based upon an interrupt signal received from the audio circuit.

In a fourth embodiment, the means for synchronizing includes means for transferring surround sound audio data to the audio circuit and means, connected to the audio circuit, for decoding data patterns within the surround sound data and for synchronizing output from the audio circuit in accordance with the data patterns within the surround sound channel. The data patterns decoded may be audio signal patterns or frame boundary data patterns.

In a fifth embodiment, the means for synchronizing includes means for comparing the FIFO buffers of the audio circuit and the USB controller to determine whether data is being accessed faster in one than the other and means for varying the data transference rates of the respective FIFOs to maintain uniform transfer rates. The data transference rates may be varied by varying the clock rate of either the clock signal connected to the audio circuit or the clock signal connected to the USB controller.

In a sixth embodiment, the means for synchronizing includes means for determining whether the USB controller or the audio circuit is transferring data faster than the other and means for skipping selected portions of data output from the USB controller or from the sound card to compensate for any rate differences.

In each of the various embodiments, adequate synchronization of the left and right audio channels and the surround sound channels is maintained to ensure that proper three dimensional sound effects are simulated even within long audio passages during which significant clock skew may occur. Other features, objects and advantages of the invention will be apparent from the detailed description which follows and from the attached drawings.

DETAILED DESCRIPTION OF EXEMPLARY EMBODIMENTS OF THE INVENTION

With reference to the figures, exemplary embodiments of the invention will now be described. The exemplary embodiments will primarily be described with reference to block diagrams illustrating pertinent components of a computer system incorporating the invention. It should be understood that numerous components of a practical computer system incorporating the invention, which are not necessary for an understanding of the invention, are not illustrated and will not be described. Moreover, in most cases, the detailed configuration of components illustrated in the block diagrams will not be set forth as these components are either entirely conventional or are based on conventional components which can be easily modified, in accordance with the teachings provided herein, by those of ordinary skill in the art.

Figure 1:
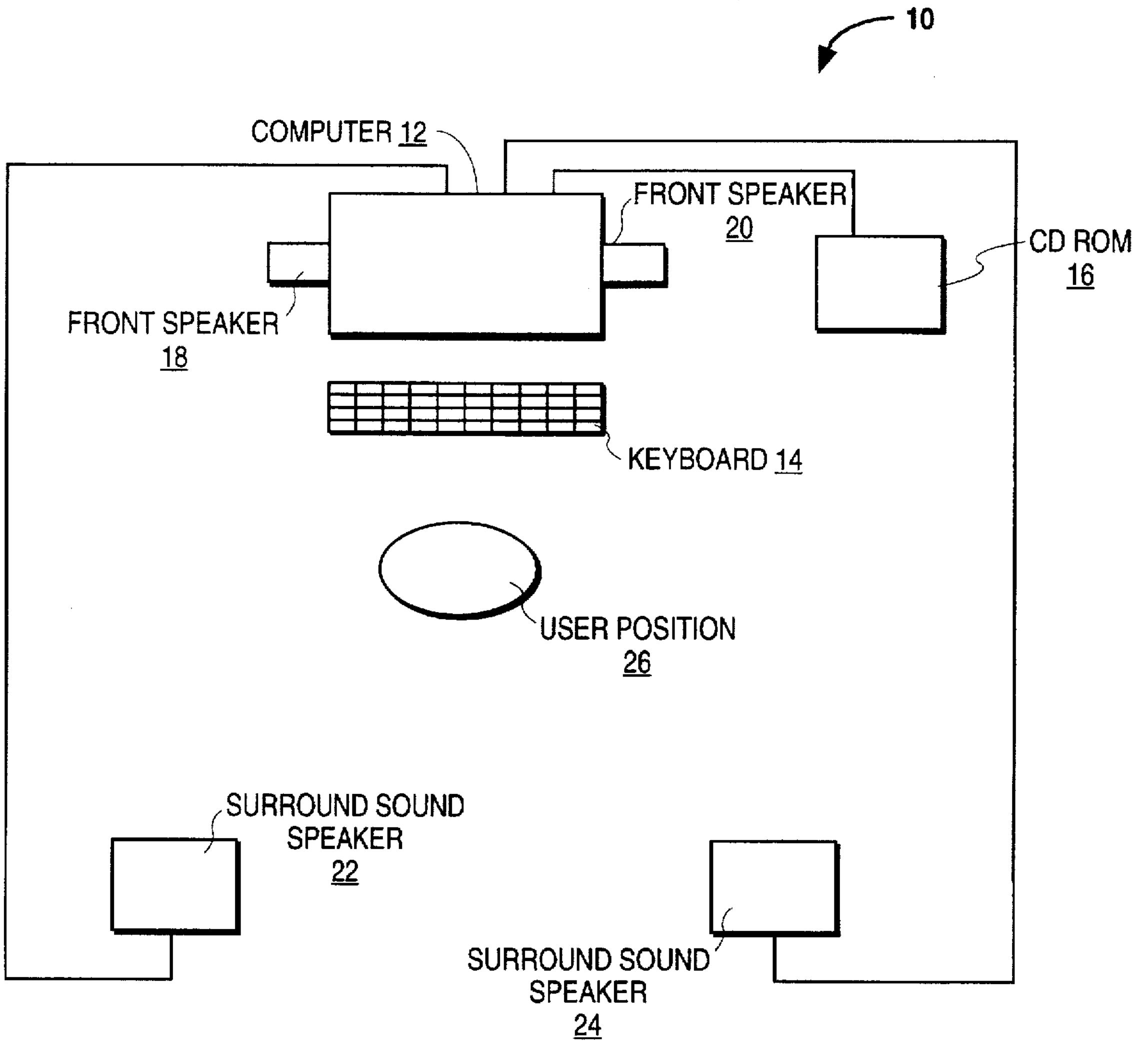
FIG. 1 is a block diagram of a personal computer system configured with surround sound capability in accordance with the invention.

FIG. 1 illustrates a computer system 10 having surround sound capability. System 10 includes a personal computer 12 shown with a keyboard 14, and external CD ROM drive 16 and a pair of built-in stereo speakers 18 and 20. A pair of surround sound speakers 22 and 24 are also provided. Surround sound speakers 22 and 24 are positioned behind a user position 26 and audio passages, perhaps provided by CD ROM 16, are played through the stereo speakers and the surround sound speakers to generate a three dimensional surround sound effect for the user. More specifically, the audio passage includes left front and right front channels played through speakers 18 and 20, respectively, and left rear and right rear channels played through surround sound speakers 22 and 24. The left rear and right rear channels may include echo sound effects, synchronized with sounds provided within the left front and right front channels, for simulating a three dimensional sound.

As will be described more fully below, speakers 18 and 20 are conventional analog speakers receiving analog signals from an audio circuit within computer 12. Surround sound speakers 22 and 24 are USB peripheral digital speakers receiving digital signals from a USB controller within computer 12. Speakers 22 and 24 include internal digital-to-analog (D/A) converters for converting the digital signals to audio signals.

Although the system of FIG. 1 illustrates two surround sound speakers, in other embodiments the system may include only one surround sound speaker or may include three or more surround sound speakers.

Figure 2:
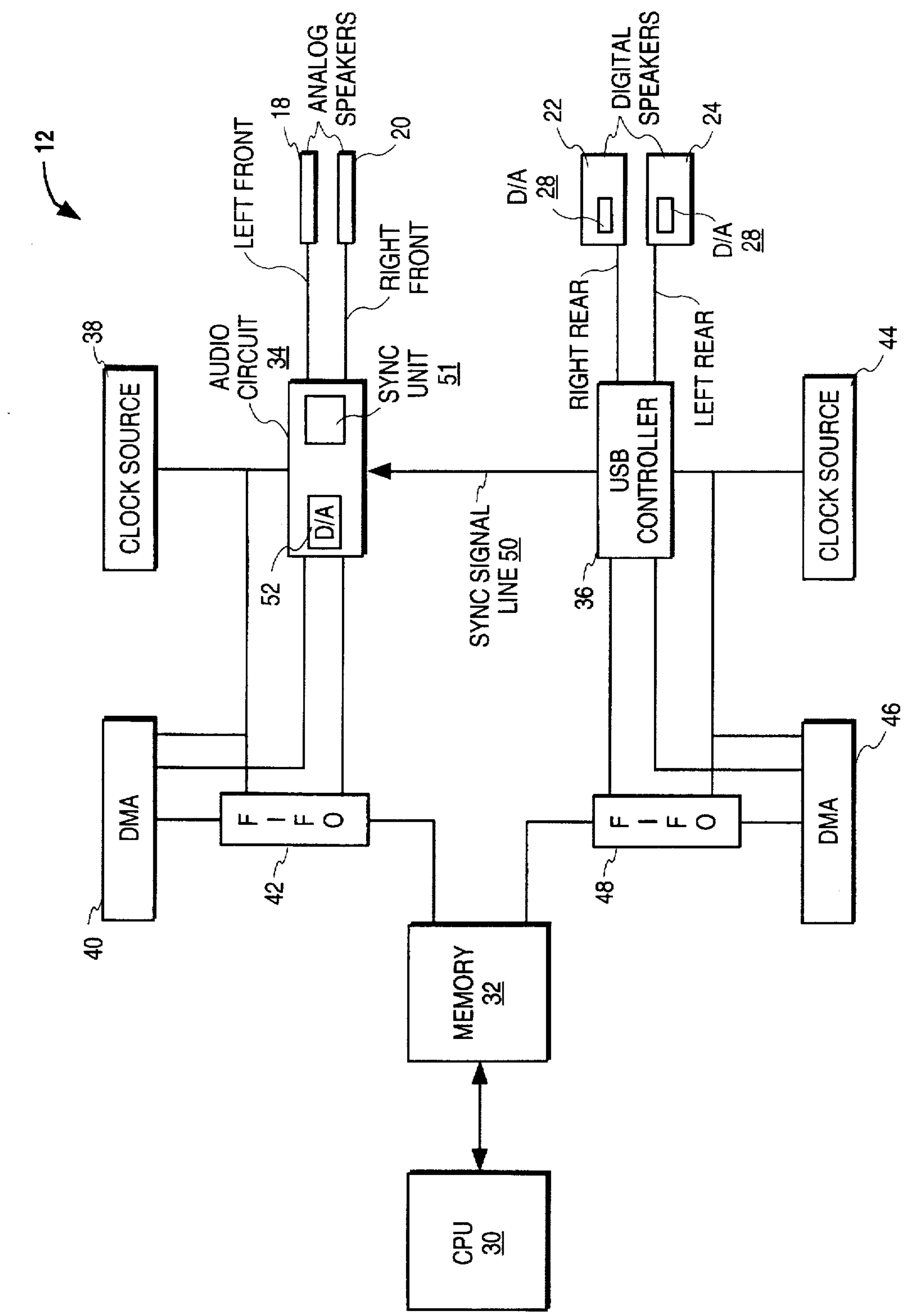
FIG. 2 is a block diagram illustrating a portion of the computer system of FIG. 1 configured in accordance with a first embodiment of the invention, wherein a synchronization signal is transmitted from a USB controller to an audio circuit.

FIG. 2 illustrates internal components of the computer 12 of FIG. 1 shown connected to front analog speakers 18 and 20 and surround sound speakers 22 and 24. Surround sound speakers both include D/A converters 28 and separate clock sources (not shown).

Pertinent components of computer 12 include a central processing unit (CPU) or microprocessor 30, a main memory 32, an audio circuit 34 and a USB controller 36 or other member of a USB interface. Audio circuit 34 is intended to represent any suitable stereo audio device, such as a sound card, or other integrated stereo audio implementation. A clock source 38, direct memory access (DMA) device 40 and FIFO buffer 42 are associated with audio circuit 34. For clarity in describing the operation of the invention, the clock source, FIFO buffer, and the DMA device are shown and described as separate components interconnected to the audio circuit. However, in other implementations, clock source 38 and FIFO buffer 42 both form integrated portions of audio circuit 34. DMA device 40 is a separate circuit connected to the audio circuit. The DMA device may be a 8237 DMA device.

A second clock source 44, a second DMA device 46 and a second FIFO buffer 48 are associated with USB controller 36. Again, for clarity in describing the operation of the invention, these components are shown as separate components. In other implementations, clock source 44, FIFO 48, as well as DMA device 46, all form integrated portions of USB controller 36. Also, as far as the clock sources are concerned, these may merely be crystal oscillators forming portions of an integrated circuit incorporating either the audio circuit components or the USB controller components.

A synchronization signal line 50 is connected between USB controller 36 and audio circuit 34. A synchronization unit 51 synchronizes surround sound channels transmitted through the USB peripheral speakers 22 and 24 with conventional stereo channels transmitted through the audio circuit to speakers 18 and 20 as follows.

In use, digitized audio data corresponding to the stereo channels and to one or more surround sound channels are stored within memory 32. The digitized audio data may originate from the CD ROM drive (FIG. 1) or may be synthesized or otherwise generated by CPU 30. The left front and right front stereo data is transmitted within a single interleaved data stream (which alternates left, right, left, right . . . ) to FIFO 42 and is retrieved therefrom by audio circuit 34. Transference of the audio data from memory 32 to audio circuit 34 is controlled by DMA device 40.

The audio circuit separates the interleaved left and right digitized stereo data signals, converts the signals to audio using a D/A converter 52, and transmits the analog left and right audio signals to analog speakers 18 and 20, respectively. Operation of the audio circuit and its associated DMA device and FIFO buffer is synchronized to a clock signal provided by clock source 38.

Also while in use, left rear and right rear surround sound digitized audio data is transmitted from memory 32 through FIFO 48 into USB controller 36 for transmission to digital speakers 24 and 22, respectively. Unlike the interleaved stereo channels, the left rear and right rear surround sound channels are separate channels. Also, whereas the audio circuit includes a D/A converter for converting digitized audio into analog signals, the USB controller merely forwards digitized surround sound channels to speakers 22 and 24.

Operation of USB controller 36 and its associated DMA device and FIFO buffer are synchronized in accordance with the clock signal provided by clock source 44.

Clock signals generated by clock sources 38 and 44 are completely asynchronous and phase unaligned. Moreover, the clock signals may have slightly different clock rates. For example, whereas one may be precisely 40 MHz, the other may be 39.99 MHz. To ensure that the audio signals output to the speakers from the audio circuit and from the USB controller remain in synchronization, a synchronization signal is transmitted along line 50 from the USB controller to the audio circuit. The synchronization unit of the audio circuit synchronizes the output audio signals to speakers 16 and 18 in accordance with the synchronization signal.

The synchronization signal may be generated by USB controller 36 in response to the detection of frame boundaries within USB frames containing digitized surround sound data received from FIFO 48 under the control of DMA 46.

Figure 3:
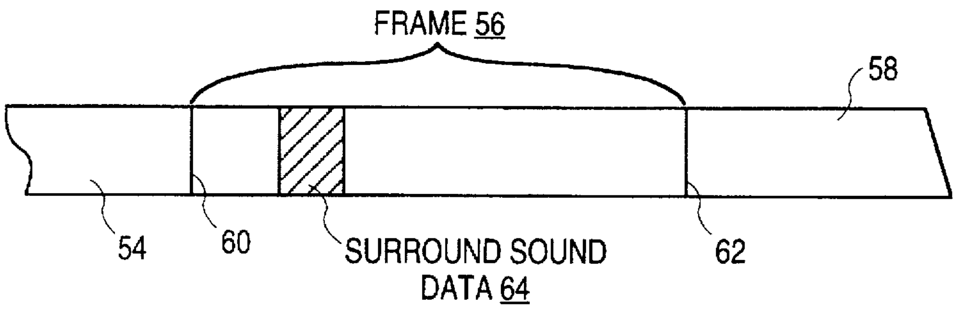
FIG. 3 is a block diagram illustrating a frame of data received by the USB controller of FIG. 2.

FIG. 3 illustrates an exemplary sequence of frames 54, 56 and 58 separated by frame boundaries 60 and 62. Each frame includes a predetermined amount of data, a portion of which is surround sound data 64. In accordance with USB protocol, the transmission of each frame boundary is exactly one millisecond apart. The surround sound data may be stored anywhere within the frame.

Referring again to FIG. 2, the USB controller 36 generates the synchronization signal, for transmission over line 50, upon the detection of each frame boundary. Accordingly, the synchronization unit of the audio circuit receives synchronization pulses, each separated by about one millisecond, although the actual period may vary as a result of the aforementioned clock skew.

Upon the detection of the frame boundary, the USB controller also decodes any surround sound data stored within the previously received frame, then outputs the data to the surround sound speakers during the next one millisecond frame. Accordingly, a one millisecond delay may occur between reception of the surround sound data and its output to the surround sound speakers.

As noted, the synchronization unit of audio circuit receives the synchronization pulse and synchronizes output audio signals to the stereo speakers in accordance with the synchronization signal. To account for the one millisecond delay within the USB controller, the audio circuit also includes a delay circuit (not separately shown) for delaying the output audio signals by one millisecond.

The actual configuration of the synchronization unit and the manner by which the synchronization line is connected to the audio circuit depends upon the configuration of the audio circuit itself. Because the invention may be employed in connection with a wide variety of audio circuits provided by a wide variety of vendors, specific details regarding connection of the synchronization line is not provided herein but can be readily determined by those skilled in the art. In a typical implementation, the "synchronization unit" merely represents pre-existing circuitry elements of the audio circuit configured for controlling output of the audio circuit in accordance with input control signals.

Hence, by generating a synchronization pulse upon the detection of USB frame boundaries, and by transmitting the pulse to the audio circuit, the audio circuit "paces" itself to the USB controller to maintain synchronization of the left and right front audio channels with the left and right rear audio channels.

In the remaining figures, alternative embodiments of the invention will be described. Each of these embodiments is similar to that of FIG. 2 and like reference numerals, incremented by multiples of one hundred, are employed to identify like components. Only pertinent differences between the embodiments will be described.

Figure 4:
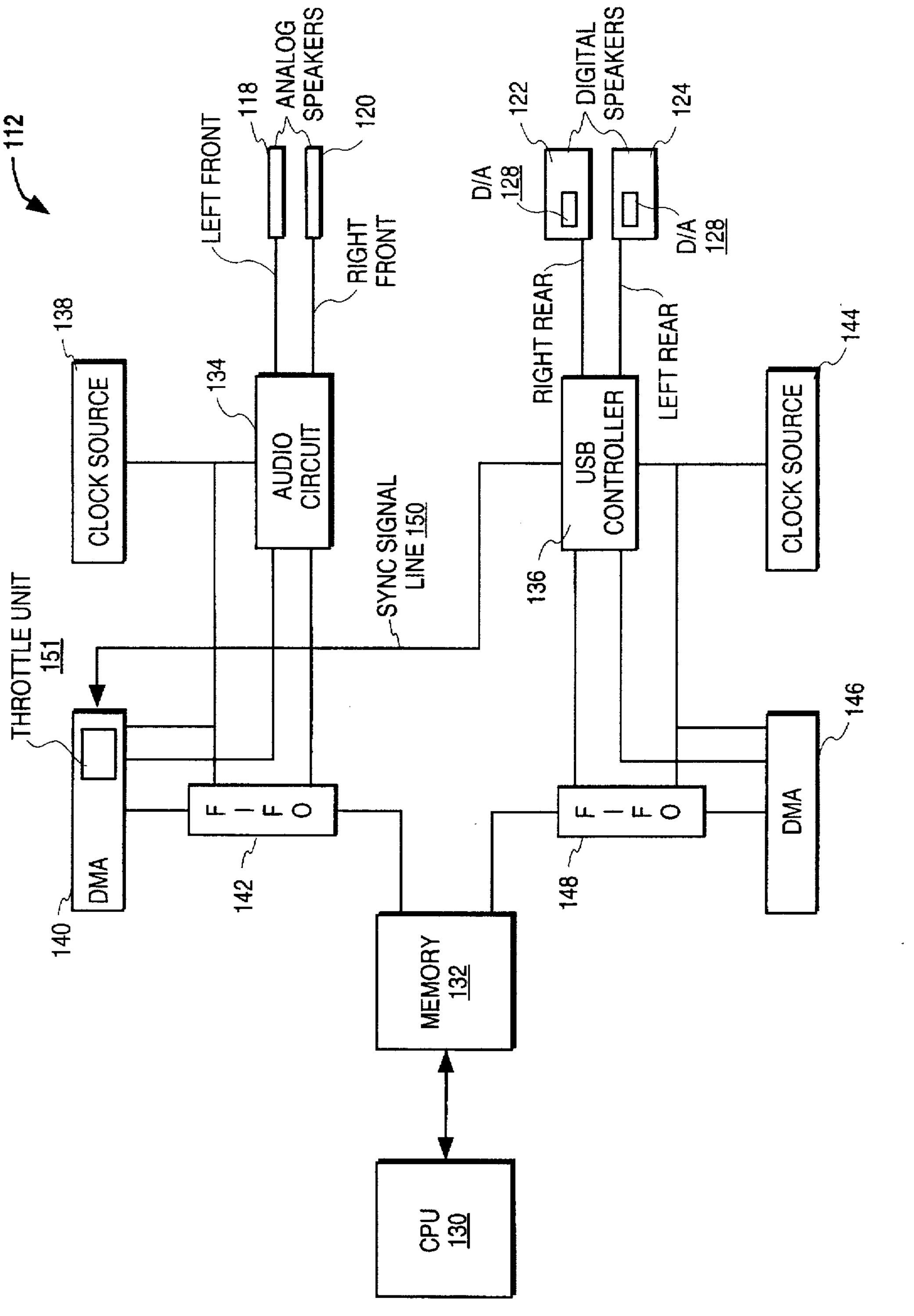
FIG. 4 is a block diagram, similar to that of FIG. 2, but configured in accordance with a second embodiment of the invention, wherein means are provided for throttling the DMA of the audio circuit based upon a synchronization signal received from the USB controller.

FIG. 4 illustrates a computer 112 having a synchronization signal line 150 connected between the USB controller 136 and a DMA device 140. Device 140 is also connected to an audio circuit 134. Hence, unlike the embodiment of FIG. 2 wherein a synchronization signal line is connected directly into the audio circuit, in the embodiment of FIG. 4, the synchronization signal line is connected to the DMA of the audio circuit. DMA device 140 is configured to monitor the relative transmission rate of the digitized data through FIFO 142 to audio circuit 134. If the DMA 140 determines that the audio circuit is "getting ahead" of the USB controller, DMA 140 delays transmitting DMA acknowledgment signals to the audio circuit. The acknowledgment signals indicate the availability of data within FIFO 142 for transference to audio circuit 134. By delaying the transmission of the acknowledgment signal, the overall data transference rate of the stereo audio channels is slowed to maintain synchronization with the surround sound channels processed by the USB controller. It should noted that, within the embodiment of FIG. 4, no provision is made for synchronizing the audio signals in the event that the audio circuit falls behind the USB peripheral.

In FIG. 4, a throttle unit 151 is illustrated within DMA device 140. The throttle units represent the actual components of the DMA device which receive the synchronization signal and delay transmission of acknowledgment signals as described above. Depending upon the implementation, the throttle unit may merely represent pre-existing circuit components of the DMA device configured to control the transmission of acknowledgment signals in response to input signals. In other implementations, the throttle unit may represent additional circuitry provided within an otherwise conventional DMA device.

Figure 5:
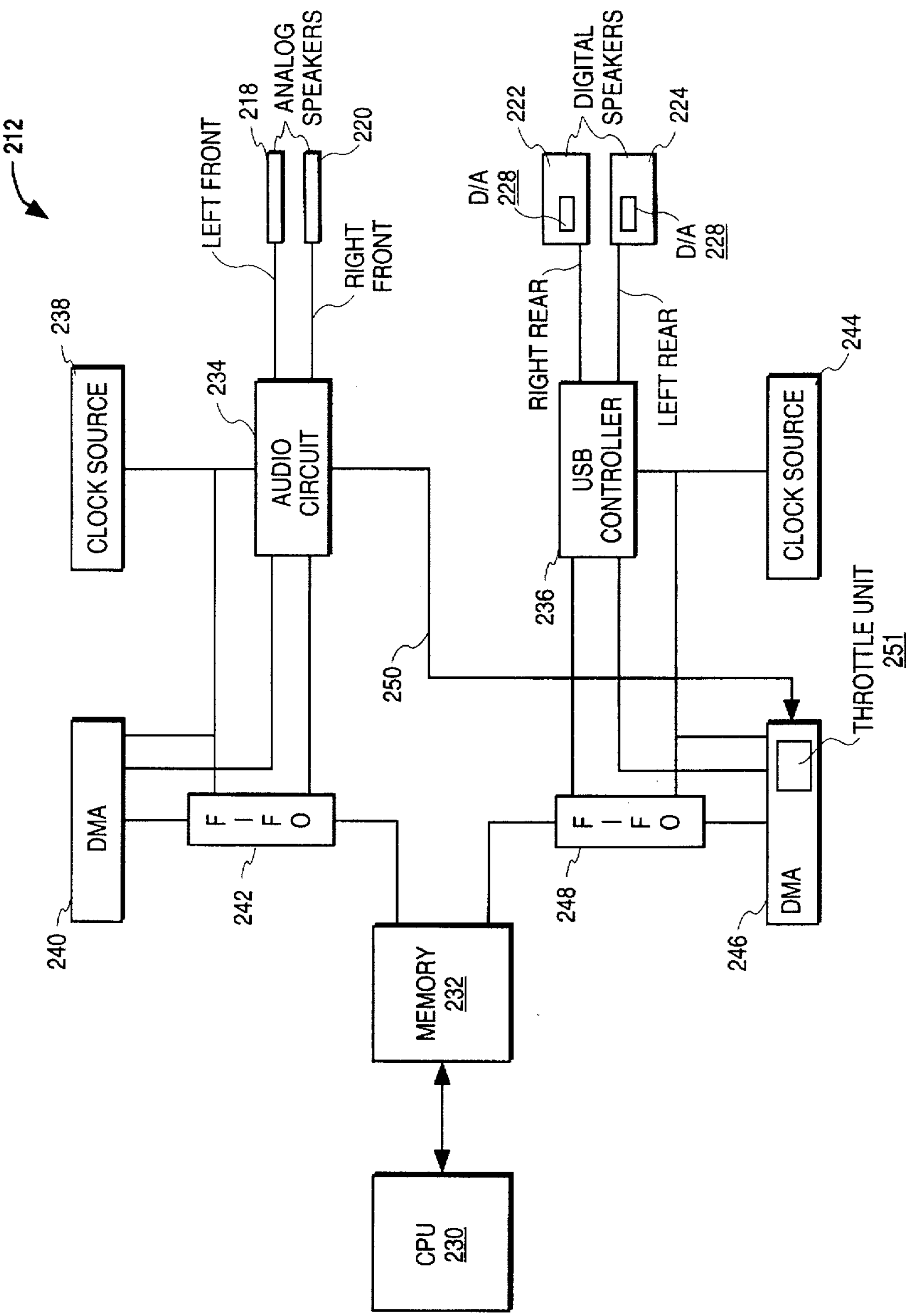
FIG. 5 is a block diagram, similar to that of FIG. 2, but configured in accordance with a third embodiment of the invention, wherein means are provided for throttling the DMA of the USB controller based upon an interrupt signal received from the audio circuit.

FIG. 5 illustrates an alternative system wherein an interrupt signal is transmitted over an interrupt line 250 from an audio circuit 234 to a DMA device 246 associated with a USB controller 236. The interrupt signal is equivalent to the synchronization pulse employed within the embodiments of FIGS. 2–4. DMA device 246 receives the interrupt signal and determines whether the USB controller is "getting ahead" of the audio circuit, then delays the transmission of FIFO acknowledgment signals to the USB controller to compensate for any discrepancy.

FIG. 5 illustrates a throttle unit 251 within DMA device 246. As with the throttle unit of FIG. 4, throttle unit 251 represents those portions of the DMA device which actually delay transmission of acknowledgment signals to thereby "throttle" DMA. Throttle unit 251 may represent pre-existing components of the DMA device capable of controlling the transmission of acknowledgment signals in response to input signals. In other implementations, the throttle unit may represent additional circuitry provided within the DMA device.

Figure 6:
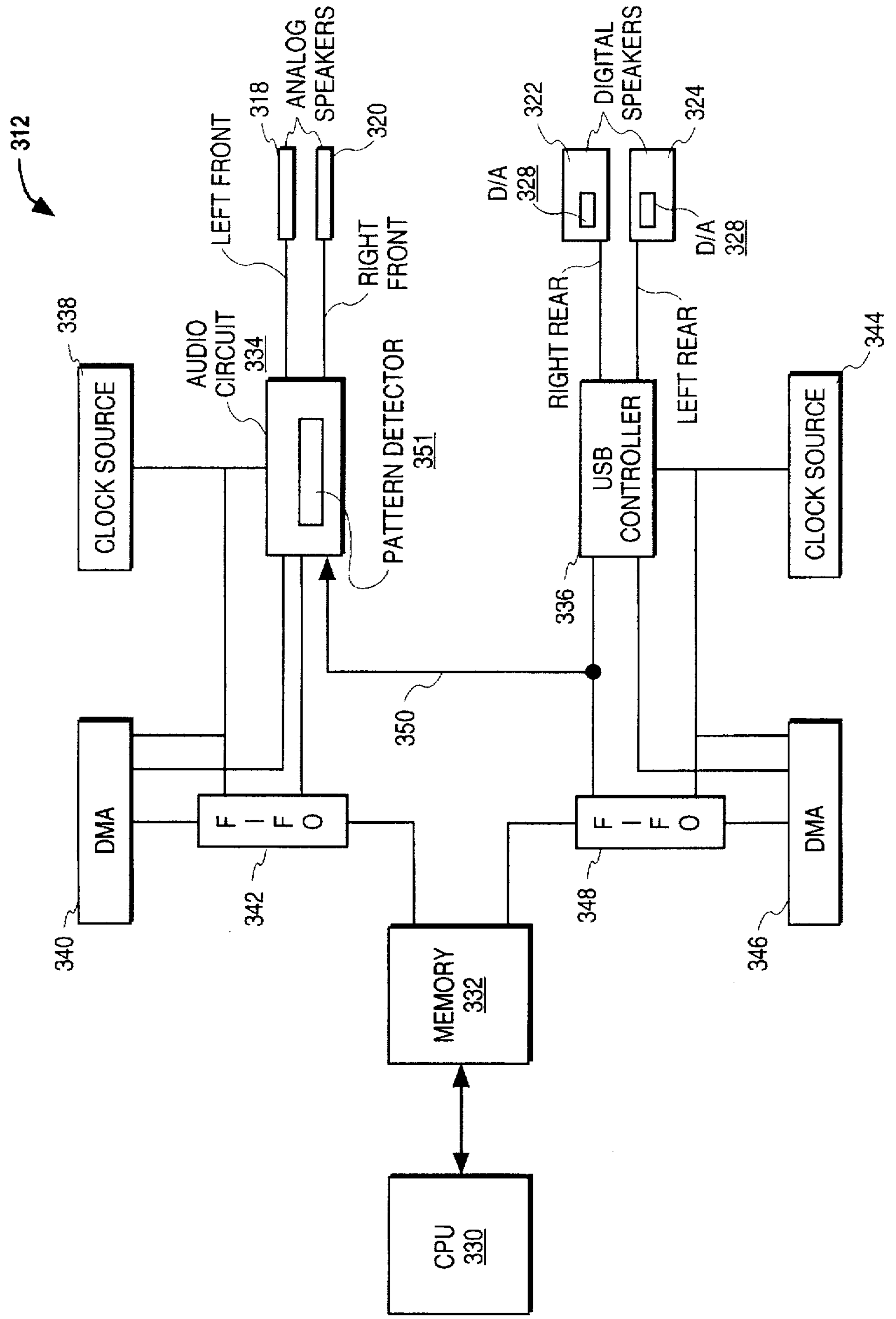
FIG. 6 is a block diagram, similar to that of FIG. 2, but configured in accordance with a fourth embodiment of the invention, wherein surround sound audio data is transferred to the audio circuit which detects audio patterns within the surround sound data and synchronizes its output from the audio circuit in accordance with the data patterns.

FIG. 6 illustrates an embodiment similar to that of FIG. 2 but, rather than transmitting a synchronization pulse from the USB controller to the audio circuit, the actual USB frames containing the surround sound data for one of the surround sound channels are transmitted to the audio circuit along line 350. A pattern detection circuit 351, provided within the audio circuit or connected thereto, examines the data frames and identifies the location of audio data within the frame and paces the output of the audio circuit in accordance therewith. As an alternative, the pattern detector may detect the end of frame boundaries.

Figure 7:
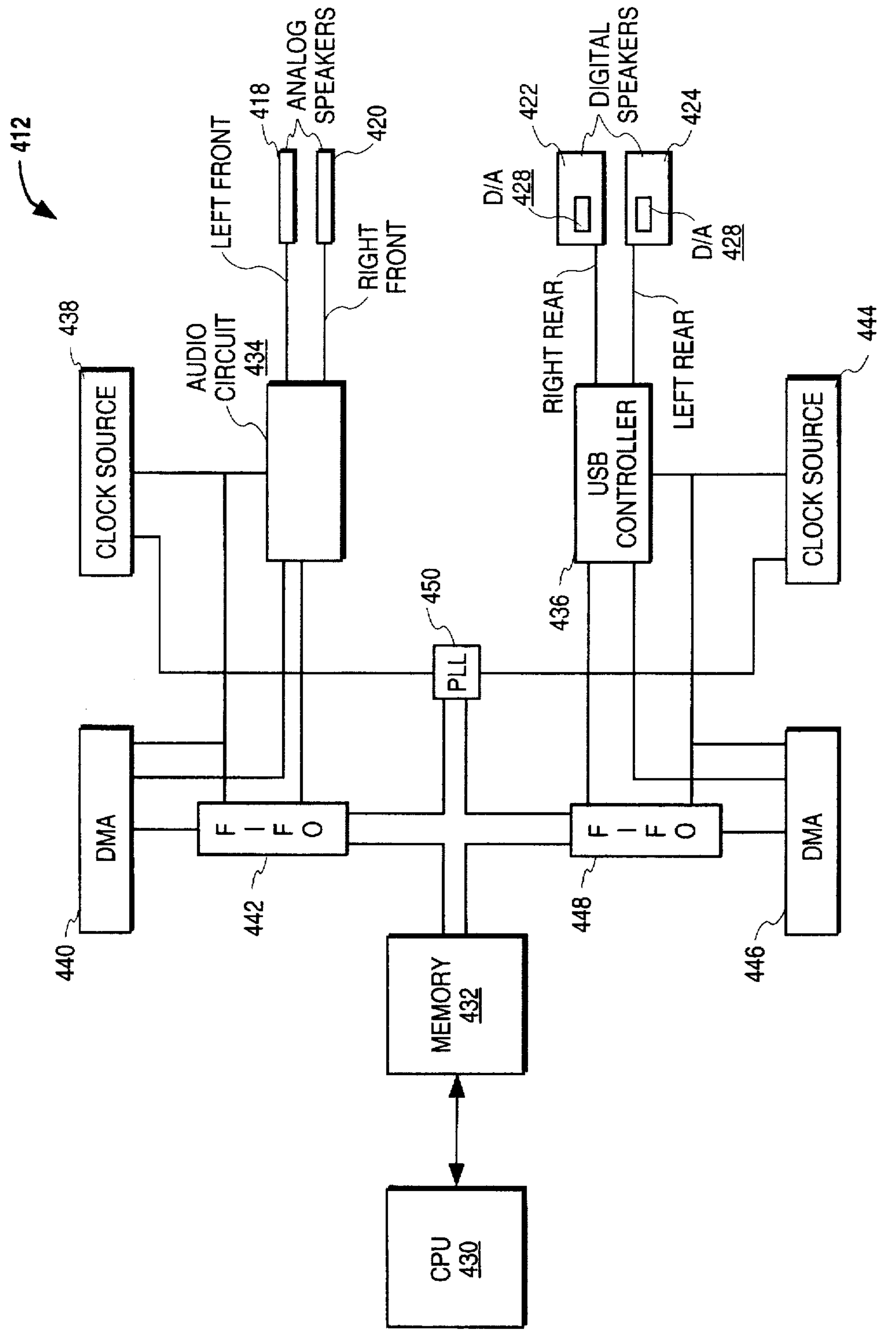
FIG. 7 is a block diagram, similar to that of FIG. 2, but configured in accordance with a fifth embodiment of the invention, wherein FIFO buffers of the audio circuit and the USB controller are compared to detect differences in transfer rate and the clock signals are varied accordingly.

FIG. 7 illustrates an alternative embodiment wherein a software phase lock loop (PLL) is employed to maintain synchronization. A software PLL unit 450, which may comprise software running on the CPU, monitors the audio circuit FIFO 442 and the USB FIFO 448 to determine any discrepancy in audio data transference rates. If a discrepancy is detected, the software PLL unit controls either audio circuit clock source 438 or USB clock source 444 to speed up or slow down to compensate for the discrepancy. In other words, the actual clock rate of one or both of the clock signals is varied to compensate for any discrepancies in data transference rates. As an alternative, the two clock sources may be directly connected by a PLL mechanism to maintain uniform clock rates without requiring a separate software PLL unit and without requiring examination of the respective FIFO buffers.

Figure 8:
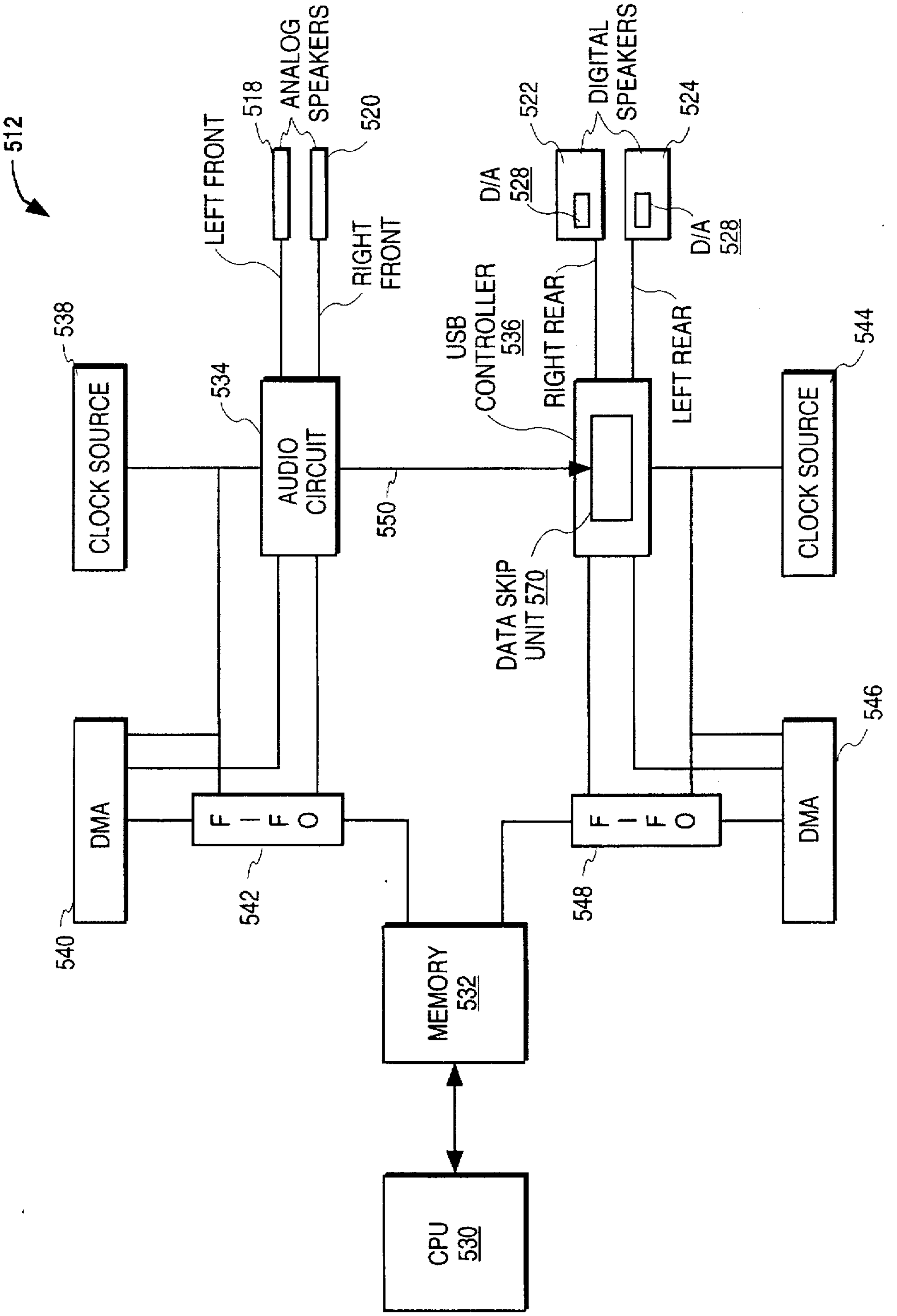
FIG. 8 is a block diagram, similar to that of FIG. 2, but configured in accordance with a sixth embodiment of the invention, wherein selected portions of either the audio data or the surround sound data are skipped to compensate for any data transfer rate differences.

FIG. 8 illustrates an alternative embodiment of the computer system wherein the USB controller 536 is configured to skip portions of the surround sound data to maintain synchronization with the audio channels output by the audio circuit. An interrupt line 550 is connected from the audio circuit to the USB controller allowing the data skip unit 570 to determine whether the USB controller is "falling behind" the audio circuit device. If so, the data skip unit 570 causes the USB controller to merely skip one or more frames of data to allow the USB controller to "catch up" with the audio circuit.

Figure 9A:
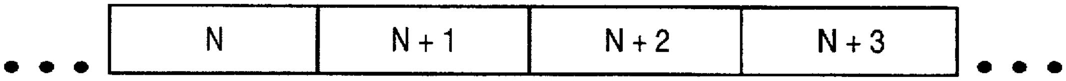
FIG. 9A is a block diagram illustrating a sequence of input data frames, processed by the computer system of FIG. 8.
Figure 9B:
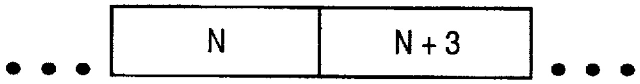
FIG. 9B is a block diagram illustrating an output sequence of data frames provided by the computer system of FIG. 8.

FIG. 9A illustrates an input sequence of USB frames containing audio data including frames N, N+1, N+2 and N+3. FIG. 9B illustrates the sequence of audio frames after processing by the data skip unit. As can be seen, data frames N+1 and N+2 are skipped such that N+3 immediately follows frame N.

If the data skip unit determines that the USB controller is "getting ahead" of the audio device, the data skip unit inserts frames of blank data to allow the audio circuit to "catch up". As an alternative, rather than inserting blank data, which may result in possible distortion of the surround sound audio output, the data skip unit may insert a frame containing artificial audio data, perhaps time averaged audio data or the like.

Although not separately shown, the audio circuit could alternatively be configured to include a data skip unit to perform the same function, but for the stereo audio data rather than a surround sound data.

What has been described is a method and apparatus for integrating surround sound capability into a computer system having a stereo audio circuit. Left and right stereo audio channels are routed through an audio circuit whereas one or more surround sound channels are routed through a USB controller, or other isochronous device. A variety of mechanisms for improving synchronization of the stereo channels and the surround sound channels have also been set forth. The actual implementation of the synchronization mechanism may depend on the specific audio circuit or USB controller employed. Accordingly, no attempt has been made to set forth all implementation details and such details may be readily determined by those skilled in the art based upon the teachings provided herein for use with specific audio circuit or USB controller components.

Moreover, principles of the invention may be applied in other systems to solve other problems than those specifically described herein. In general, the exemplary embodiments described herein are merely illustrative of the principles of the invention and should not be construed as limiting the scope of the invention.

What is claimed is:

1. A system for producing three-dimensional sound via a pair of front speakers and at least one rear speaker comprising:

first means for providing audio data;

audio circuit means for converting the audio data into an audio channel signal coupled to the pair of front speakers according to a first clock signal;

second means coupled to the first means for generating a surround sound channel signal from the audio data, the surround sound channel signal being provided to the at least one rear speaker according to a second clock signal, wherein the first and second clock signals are asynchronous; and further wherein the second means provides a signal coupled to the audio circuit means that synchronizes the surround sound channel signal with audio channel signal.

2. The system of claim 1 wherein the second means includes phase-locked loop (PLL) means for determining a discrepancy between audio data transference rates associated with the surround sound channel signal and the audio channel signal, the discrepancy causing the PLL means to vary the first and/or second clock signals.

3. The system of claim 1 wherein the signal comprises a synchronization signal generated by the second means at a frame boundary of the audio data.

4. The system of claim 1 wherein the first means includes:

a central processing unit (CPU); and a memory coupled to the CPU, the memory storing the audio data.

5. The system of claim 4 wherein the second means comprises a Universal serial bus controller.

6. The system of claim 4 wherein the audio circuit means includes:

a direct memory access (DMA) device that controls transference of the audio data from the memory to the audio circuit means; and a throttle unit that slows a data transference rate associated with the DMA device to maintain synchronization of the surround sound channel signal and the audio channel signal.

7. The system of claim 4 wherein the audio circuit means includes a pattern detection circuit, and the signal comprises surround sound data, the pattern detection circuit pacing the output of the audio channel signal in accordance with data frames of the surround sound data.

8. The system of claim 5 wherein the Universal serial bus controller includes:

means for skipping selected portions of data output from the Universal serial bus controller to compensate for audio data rate differences associated with the surround sound channel signal and the audio channel signal.

9. In a computer system for producing three-dimensional sound via a pair of front speakers and at least one rear speaker, a method of operation comprising the steps of:

converting audio data into an audio channel signal coupled to the pair of front speakers according to a first clock signal;

generating a surround sound channel signal from the audio data, the surround sound channel signal being provided to the at least one rear speaker according to a second clock signal, wherein the first and second clock signals are asynchronous; and synchronizing the surround sound channel signal with the audio channel signal.

10. The method of claim 9 wherein the step of synchronizing includes the step of throttling a direct memory access (DMA) device that transfers the audio data to an audio circuit which generates the audio channel signal.

11. The method of claim 9 wherein the surround sound channel signal is generated by a device controller, with the audio data being transferred to the device controller by a direct memory access (DMA) device associated with the device controller, and wherein the step of synchronizing includes the steps of:

providing an interrupt signal from the audio circuit to the DMA device; and controlling an output of the DMA device in accordance with the interrupt signal.

12. The method of claim 9 wherein the step of synchronizing comprises the steps of:

providing the audio data to an audio circuit;

decoding data patterns present within the audio data; and outputting the audio channel signal from the audio circuit synchronous with a boundary of the data patterns.

13. The method of claim 9 wherein the audio channel signal is generated by an audio circuit and the surround sound channel signal is generated by a device controller, and further wherein the step of synchronizing comprises the steps of:

determining whether the device controller is operating at a different data rate than that of the audio circuit; and skipping selected portions of data output from the device controller to compensate for the different data rate.

14. A system for producing three-dimensional sound via a pair of front speakers and at least one rear speaker comprising:

a central processing unit (CPU); and a memory coupled to the CPU, the memory storing audio data;

an audio circuit that converts the audio data into an audio channel signal which is coupled to the pair of front speakers according to a first clock signal;

a controller coupled to the memory that generates a surround sound channel signal from the audio data, the surround sound channel signal being provided to the at least one rear speaker according to a second clock signal, wherein the first and second clock signals are asynchronous; and further wherein the controller provides a synchronization signal coupled to the audio circuit that synchronizes the surround sound channel signal with audio channel signal.

15. The system of claim 14 wherein the synchronization signal is generated by the controller at a frame boundary of the audio data.

16. The system of claim 14 wherein the audio circuit includes:

a direct memory access (DMA) device that controls transference of the audio data from the memory to the audio circuit; and a throttle unit that slows a data transference rate associated with the DMA device to maintain synchronization of the surround sound channel signal and the audio channel signal.

17. The system of claim 14 wherein the synchronization signal comprises surround sound data and the audio circuit includes:

a pattern detection circuit which paces the output of the audio channel signal in accordance with data frames of the surround sound data.

18. The system of claim 14 wherein audio circuit includes:

a phase-locked loop (PLL) that determines a discrepancy between audio data transference rates associated with the surround sound channel signal and the audio channel signal, the discrepancy causing the PLL to vary the first and/or second clock signals.

* * * * *